United States Patent [19]

Tomozawa

[11] 3,766,542

[45] Oct. 16, 1973

[54] CODE CONVERSION APPARATUS

[75] Inventor: Atsushi Tomozawa, Tokyo, Japan

[73] Assignee: Nippon Electric Company, Limited, Tokyo, Japan

[22] Filed: June 15, 1971

[21] Appl. No.: 153,386

[30] Foreign Application Priority Data

June 22, 1970 Japan ................................ 45/54225

[52] U.S. Cl.. 340/347 DD, 179/15 AV, 235/92 EV, 325/38 B

[51] Int. Cl. ........................................... H03k 13/24

[58] Field of Search ............................ 340/347 DD; 332/11 D; 325/38 B; 235/92 EV; 179/15 AV

[56] References Cited

UNITED STATES PATENTS 3,500,441 3/1970 Brolin................................ 325/38 B 3,596,267 7/1971 Goodman.......................... 325/38 B

*Primary Examiner*—Thomas J. Sloyan

*Attorney*—Richard C. Sughrue et al.

[57] ABSTRACT

Disclosed herein is a code conversion system for converting, in the digital phase, a prediction type first code to a lower frequency, prediction type second code approximating the information content of the first code. In a first embodiment, an input delta modulation code is converted to a lower frequency output delta modulation code, while in a second embodiment, an input delta modulation code is converted to a lower frequency companding delta modulation code.

9 Claims, 6 Drawing Figures

INVENTOR
ATSUSHI TOMOZAWA

BY Sughrue, Rothwell, Mion, Zinn & Macpeak
ATTORNEYS

CODE CONVERSION APPARATUS

This invention relates to a code conversion apparatus for converting a code signal into another code signal and, more particularly, to such a conversion apparatus for converting a code signal of the prediction type, such as a delta modulation code signal, into a similar code signal having a lower clock frequency.

It is known that the delta modulation system is the simplest coding system of the prediction type. Its simple circuit arrangement simplifies the analog-digital conversion process. However, it is not advantageous in that a relatively high sampling speed is needed to obtain a transmission quality comparable to PCM and other systems.

Besides the linear delta modulation system, several prediction-type coding systems are known such as companding deltamodulation system (See "High Information Delta Modulation," by Marion R. Winkler, 1963 International Convention Record, Part 8, pp. 260 – 265) and delta-PCM systems (See "Predictive Quantizing of Television Signals" by Robert E. Graham, 1958 IRE Wescon Convention Record, Part 4, pp. 147 – 157). In the former, the sampling step size is controlled in response to the preceeding bit or bits of the coded signal, while in the latter, only the increment or difference in the sampled original signal is pulse-code modulated (PCM). However, these systems need complicated and expensive circuit arrangements because complicated signal processing of different step sizes are needed in the analogue phase as compared with the linear delta-modulation system. Furthermore, they need the high sampling speed as is the case with the above-mentioned linear delta modulation system.

As outlined above, the prediction-type coding represented by the linear delta modulation must have a high sampling frequency to ensure a predetermined quality of transmission. If a communication network is to be set up using this type of coding, the clock frequency should be considerably high. However, in an extensive communication network, there are usually some local parts where the clock frequency need not be so high because of the relatively low amount of information to be transmitted or of the relatively low standards required for the transmission quality. For such parts of the total network, the coding apparatus operable at lower sampling frequency may be substituted for the regular coding apparatus, reducing the total cost of the network as a whole.

It is therefore an object of this invention to provide an inexpensive and stable communication network employing the delta modulation or other prediction-type coding, in which the code signals transmitted in such local parts of the communication network are converted in the digital phase, without involving the analog process such as decoding and recoding, into separate code signals with lower clock frequency.

Now, the subject matter of the present invention will be described in more detail with reference to the accompanying drawings, wherein.

Figure 1:
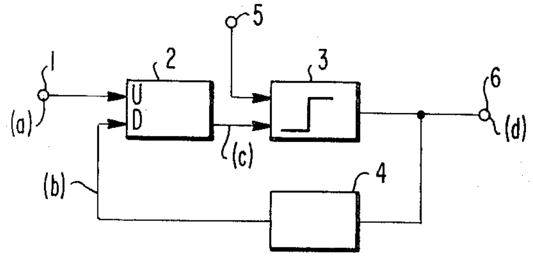
FIG. 1 is a block diagram showing an embodiment according to the present invention.

Now, referring to FIG. 1, the ordinary delta modulation code signal to be converted is applied to an input terminal 1 and led to a counting-up terminal U of a reversible counter circuit 2. The contents of the reversible counter circuit 2 are monitored by a code discriminating circuit 3 at every clock pulse applied to a terminal 5 and output code pulse "1" is produced at an output terminal 6 when the contents of the counter circuit 2 exceed a predetermined value. The signal at output terminal 6 is fed to a pulse generating circuit 4. This output code signal train of the code conversion apparatus is applied to the pulse generating circuit 4 which produces pulse groups each including pulses equal in number to the ratio of the difference value used in the output code signal to that used in the input code signal. The pulse groups are applied to a counting-down terminal D of the reversible counting circuit 2.

The input delta modulation code signal increases the contents of the reversible counter circuit 2, but the output pulses of the pulse generating circuit 4 decrease the contents of the counting circuit 2 in response to the output of the discriminating circuit 3, so that the contents always approach a constant value. Thus, the difference value represented by the number of the pulses of the input delta modulation signal becomes equal to the difference value represented by the converted code signal within a constant time interval, and that information signal represented by the input delta modulation code signal is included in the converted code signal train.

Figure 2:
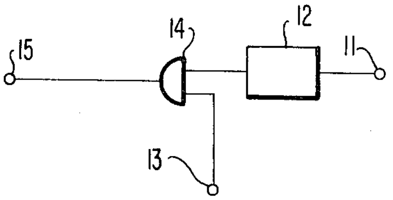
FIG. 2 is a block diagram of a pulse generating circuit used in the embodiment as shown in FIG. 1.

Assuming that the input delta modulation code signal is converted to the output delta modulation code signal using a 1/4 coding speed, the code conversion apparatus in this case can be obtained by employing the pulse generating circuit 4 as shown in FIG. 2.

In FIG. 2, the output code signal of the code discriminating circuit 3 of FIG. 1 is applied to a timing circuit 12 such as a monostable multivibrator through a terminal 11. Relatively high-speed counting pulses are applied to a terminal 13 and gated by an AND gate 14 to an output terminal 15 only when the output from the timing circuit is "1." The terminal 15 is fed back to the counting-down terminal D of the reversible counting circuit 2 shown in FIG. 1. The pulse width of the output pulses of the timing circuit 12 is so selected that only four counting pulses can pass through the gate 14. Accordingly, the pulse generating circuit shown in FIG. 2 feeds pulse groups each including four pulses to the counting-down terminal D of the reversible counter circuit 2 every time the output from the code discriminating circuit 3 becomes "1." Clock frequency of the pulses supplied to the code discriminating circuit 3 is one-fourth that of the input delta modulation code signal.

Figure 4:
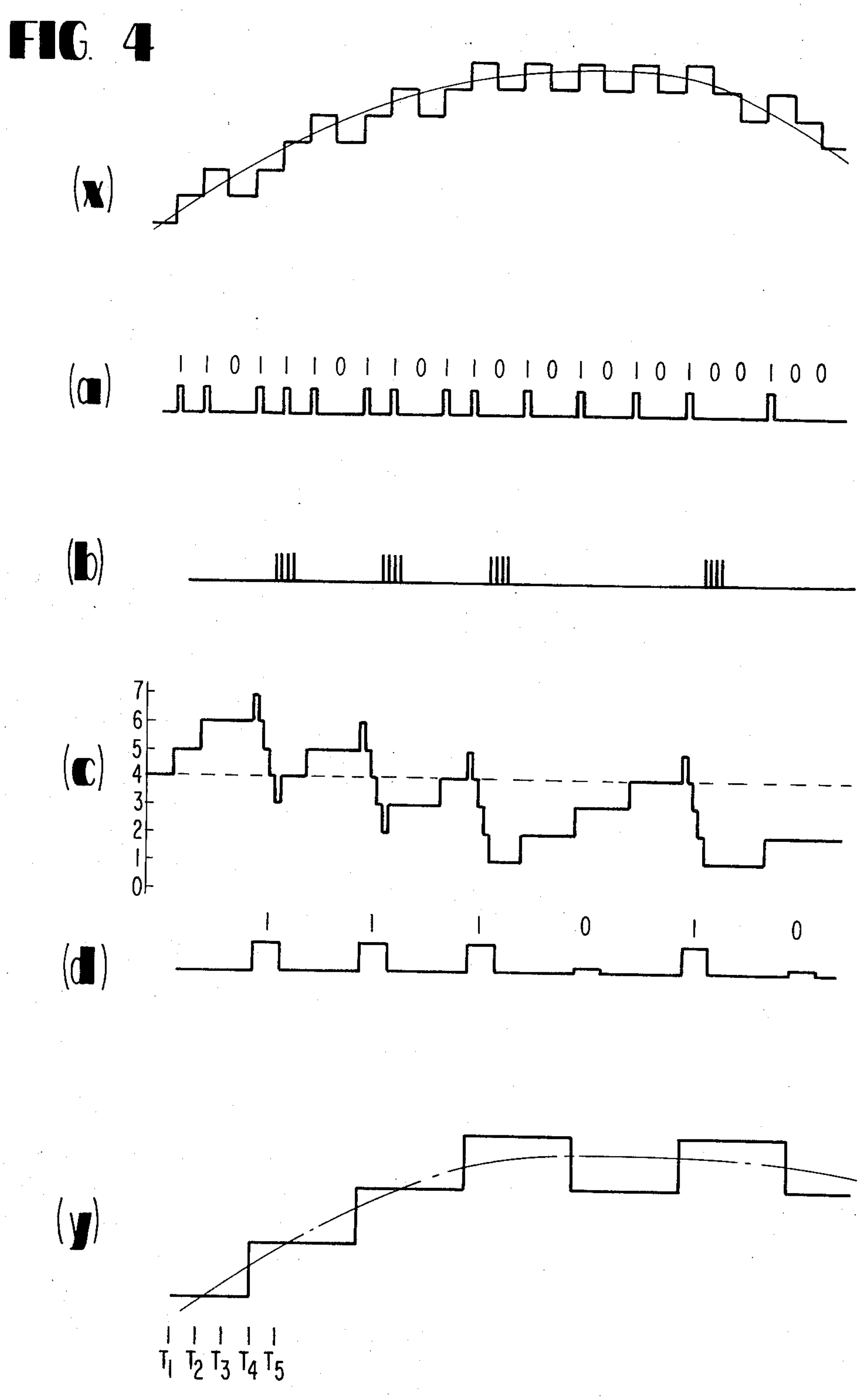
FIG. 4 is a diagram illustrating wave forms appearing at the parts of the embodiment shown in FIG. 1.

FIG. 4 shows operating waveforms appearing at parts of the embodiment of the invention, and the reference letters as shown in FIG. 4 correspond to those shown in FIG. 1. Upon application of the signals shown in FIG. 4(*a*) as the input delta modulation code signal, the reversible counter circuit 2 increases its contents one by one for every arrival of the code "1." The contents of the counter circuit 2 is indicated on the ordinate of FIG. 4(*c*) for facilitating understanding. At time point $T_4$, discrimination of the signals is effected. If the discriminating level of the discriminating circuit 3 is set to be four, the discriminating circuit 3 produces a "1" as its output, because the contents of the counter circuit is seven at the time point $T_4$. As a result, four pulses are produced from the pulse generating circuit 4 between the time points $T_4$ and $T_5$ as shown in FIG. 4(*b*) and the contents of the reversible counter circuit 2 are decreased by four. Likewise, the contents of the reversible counter circuit 2 are discriminated every fourth clock interval of the input pulse code and in case the contents are larger than four, a "1" is produced at the output of circuit 3 and the contents of the counter circuit 2 are decreased by four. In FIG. 4, waveform (*x*) shows the signal obtained when the input delta modulation code signal train is decoded, while waveform (*y*) shows the signal obtained when the converted delta modulation code signal train is decoded. It is understood from this waveform (*y*) that although the steps are four times larger than the steps in FIG. 4(*x*) due to the decrease in clock frequency an increase in quantization error is inevitable, however, a substantially correct code conversion is effected, and the signal similar to the original signal (*x*) is obtained.

Figure 3:
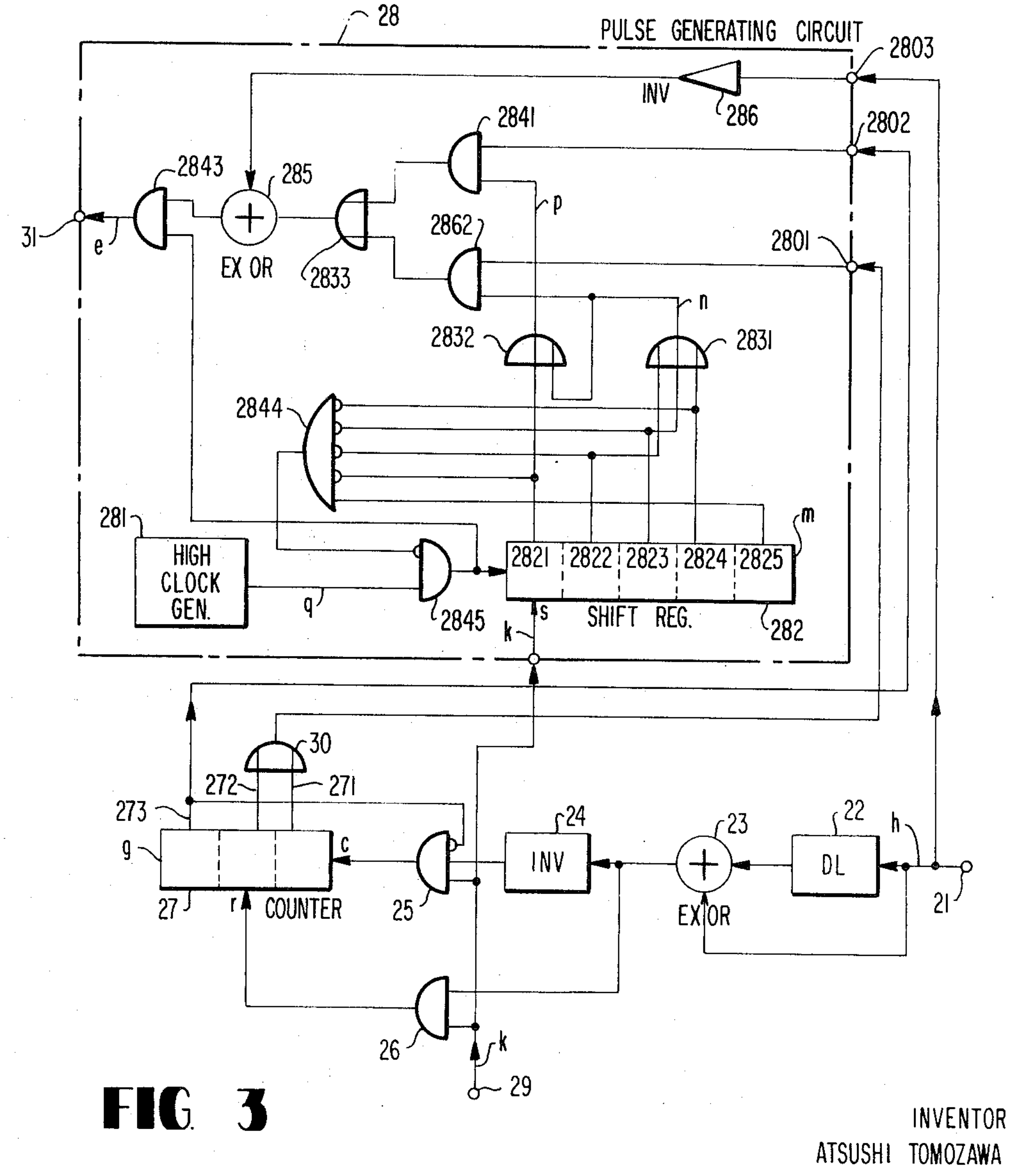
FIG. 3 is a block diagram showing another example of the pulse generating circuit.

On the other hand, the circuit shown in FIG. 3 is used as the pulse generating circuit 4 when the original delta modulation code signal train is converted to a companding delta modulation code signal train with a coding speed equal to one-fourth that of the original delta modulation code signal train, and the step size takes two kinds of values, that is, ±1 and ±2. According to the companding rule, as disclosed in the article titled "A Companded One-Bit Coder for Television Transmission" (Bell System Technical Journal, Vol. 48, No. 5, pp. 1459 – 1479, May – June, 1969) by R.H. Bosworth and J.C. Candy, when the same code signals are succeeded, the first and second codes show the step size 1, the succeeding codes thereafter show the step size 2, and the code just after code change shows the step size 1. In order to obtain the companding delta modulation code signal mentioned above, the pulse generating circuit in FIG. 3 should generate pulse groups whose number correspond to the step sizes according to the companding rule.

In FIG. 3, terminals 21 and 31 are connected to an output of the code discriminating circuit of FIG. 1 and the counting-down terminal of the reversible counter circuit 2 of FIG. 1, respectively. Like to the clock terminal 5 of FIG. 1, clock pulses having a 1/4 speed in relation to the clock rate of the incoming delta modulation code signal is supplied to a terminal 29. An output code train from the code discriminating circuit 3 is applied to a pulse generator 28, a clock delaying circuit 22 and an exclusive OR circuit 23 through the terminal 21. The output signal from the exclusive OR circuit 23 is "1" when the output code from the discriminating circuit 3 is different from the preceding code, while the output signal is "0" when the former code is the same as the latter code.

When the present code is equal to the preceding code, an AND gate 25 is opened through an inverter 24 to trigger a ternary counter 27 by clock pulses to cause the counted contents to be increased by 1. The ternary counter 27 is arranged so that the contents can increase up to 3 and when the contents is more than 3 an inhibit signal is returned from the output 273 to the AND gate 25 thereby not advancing the counting. When the preceding code is not incident with the present code, the output from the exclusive OR circuit 23 becomes "1" and opens an AND gate 26. Thus clock pulses are supplied to the reset terminal *r* of the counter 27 to reset the contents of the counter 27 to one.

The outputs implying the contents one, two and three of the counter appear at wires 271, 272 and 273, respectively. When the contents of the counter 27 are one or two, the corresponding output is applied to a control input 2801 of the pulse generator 28 through an OR gate 30, and when the contents are three, it is applied to the control input 2802. The pulse generator 28 generates at the output terminal 31 pulses whose number corresponds to the steps determined by the present code and the control inputs.

Figure 5:
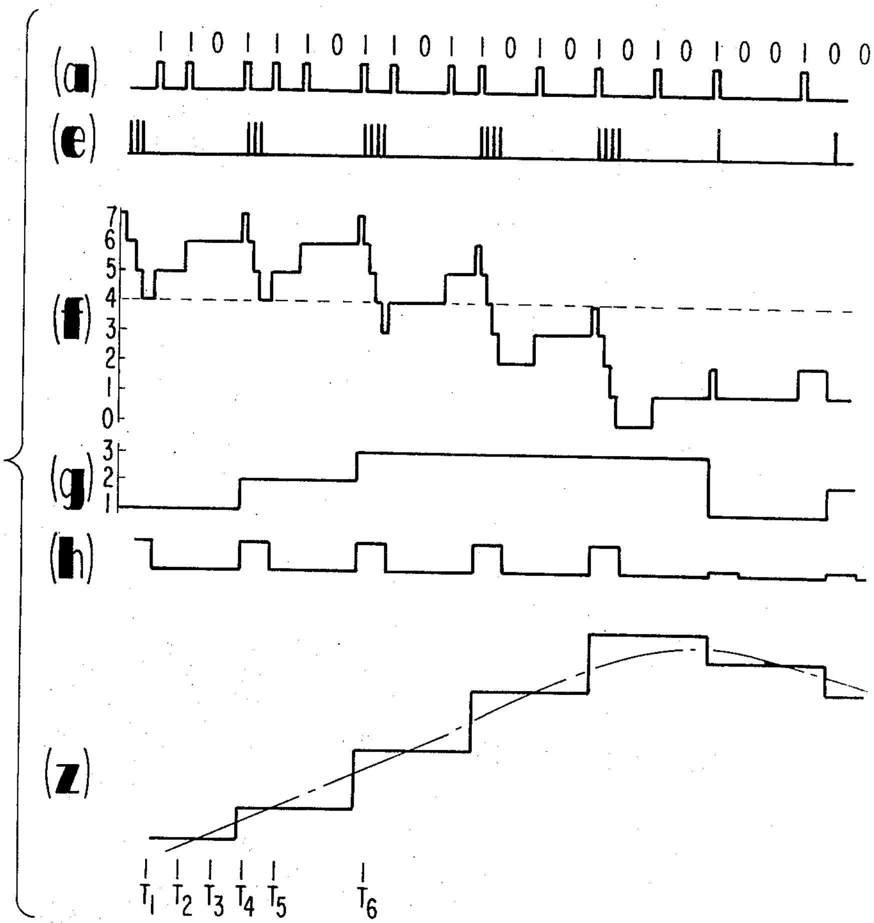
FIGS. 5 and 6 are diagrams illustrating wave forms appearing at the parts of the embodiment in FIG. 3.
Figure 6:
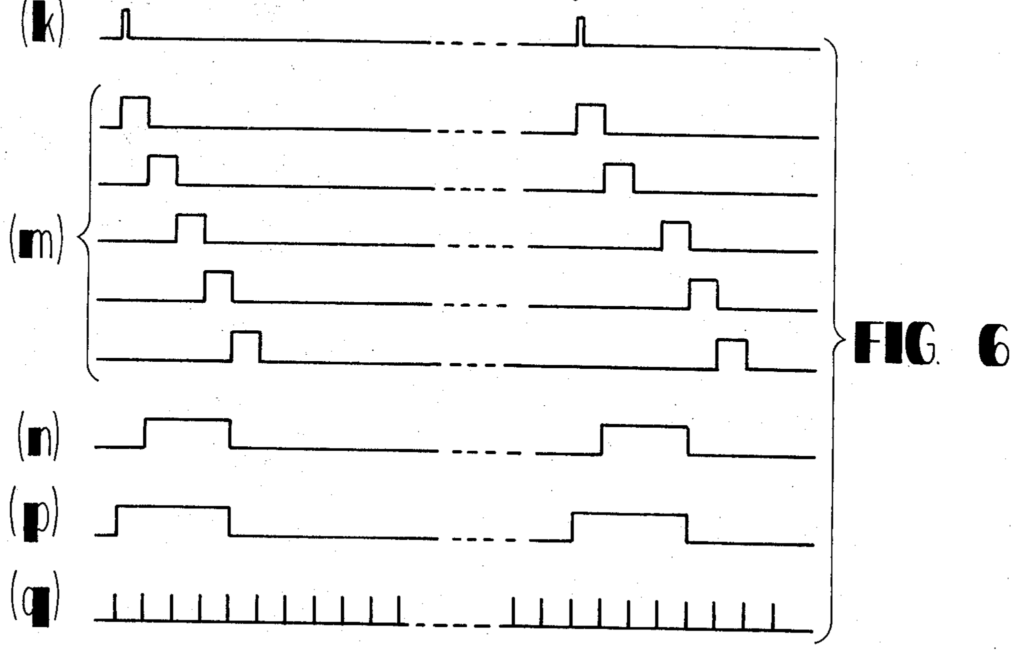

FIGS. 5 and 6 show waveforms for explaining the operation of this conversion device. These waveforms illustrate operations which may be effected when the code train (*a*) is applied as input delta modulation code signal as is in the embodiment of FIG. 1.

Assuming that at time point $T_1$ the content of the reversible counter circuit 2 is four and the content of the ternary counter 27 is one, as shown in FIG. 5(*f*) and (*g*) respectively, the content of the reversible counter 2 at time point $T_4$ will be seven and the discriminating circuit 3 will produce "1" at time point $T_4$. Hence, the ternary counter 27 advances by one and its content changes to two. At this time, the output pulse number of the pulse generator 28 is three as disclosed in detail below. Hence the content of the reversible counter circuit 2 is reduced to four by these counting-down pulses between time points $T_4$ and $T_5$, as shown in FIGS. 5(*e*) and 5(*f*). At the next discriminating time $T_6$, the code signal "1" is likewise produced by the discriminating circuit 3, and the ternary counter 27 advances to three. Therefore, the pulse generator 28 produces four pulses. Likewise, control is effected so that the content of the reversible counter circuit 2 approaches the constant value four and thus signal conversion is effected.

Now, the operation of the pulse generating circuit 28 is disclosed referring to FIGS. 3 and 6. The pulse generator 28 is constituted by a shift register 282 driven by a high frequency clock source 281, OR gates 2831 to 2833, AND gates 2841 to 2845, an exclusive OR circuit 285, and an inverter 286. The high frequency clock generator 281 generates a clock pulse train, as shown in FIG. 6(*q*), whose frequency is sufficiently high in comparison with the clock frequency of the input delta modulation code signal. The high frequency clock is applied to the shift register 282 through the gate 2845, and makes the register 282 shift. A set pulse, as shown in FIG. 6(*k*), is applied to the set terminal of the register 282. The content registered by the set pulse is shifted by the high frequency clock, and the output pulses of five stages 2821 to 2825 become as shown in FIG. 6(*m*). When the output pulse of the fifth stage becomes "1", the AND gate 2844 inhibits the gate 2845, and the contents of the register 282 are maintained until the next set pulse is applied to the set terminal. Therefore, gate pulses, as shown in FIGS. 6(*n*) and (*p*), with three and four times clock periods respectively are obtained at the output of the gates 2831 and 2832 respectively. The logic circuit including the gates 2841, 2842, 2833, 2843, the exclusive OR circuit 285 and the inverter 286 operates in response to the control signals applied to the terminals 2801 and 2802 and the code signal applied to the terminal 2803, as shown in the following table.

| Control signal at 2801 | 2802 | Code input at 2803 | Pulse number at 31 (step) |
|---|---|---|---|
| 1 | 0 | 1 | 3 (+1) |
| 0 | 1 | 1 | 4 (+2) |
| 1 | 0 | 0 | 1 (−1) |
| 0 | 1 | 0 | 0 (−2) |

It is seen from the above description that the pulse generating circuit 28 shown in FIG. 3 operates to produce pulses corresponding to the number of steps according to the companding rule of the companding delta modulation from output code signal trains from the signal discriminating circuit 3.

FIG. 5($z$) shows decoded waveform of the companding delta modulation code signal thus converted and it is seen from this waveform that the companding conversion is correctly effected to the signal in FIG. 4($x$).

In the foregoing, the present invention has been described with reference to two embodiments, however the invention is not limited to the type of code signals shown in those two embodiments, but is applicable to conversion by means of general prediction type coding system which is effected between code signals, in which the input code signals according to the first coding system are converted to the groups of pulses whose number in each group corresponds to difference value shown by input code signals and are added to the reversible counter circuit, and the output code signals from the signal discriminating circuit are converted to the pulse number corresponding to difference according to the second coding system and the pulses are differentially fed back to the reversible counter circuit.

For example, since it is easily possible to convert the differential PCM signals to pulse number by use of "Binary Rate Multiplier" disclosed in "Handbook of Automation Computation and Control," Vol. 2, pp. 29-05 – 29-09 (John Wiley & Sons), it is also possible to effect differential PCM of the first coding system. So long as the variable step size of the companding delta modulation with the companding rule different from the above-mentioned second embodiment, is an integer, it is possible to constitute a circuit for generating a pulse number corresponding to the step size and such companding delta modulation is applicable as the first or the second coding system.

Instead of the reversible counter used in the foregoing embodiments of this invention, general bilateral integration circuits can be used, since the reversible counter functions to carry out bilateral integration of the digital inputs. A typical example of the bilateral integration circuits is a digital accumulator in which a summing circuit and a register are so connected as to accumulate the input code signals. In the system using a digital accumulator, the input signal should be precounted and fed to the accumulator in the form of digital code word representing the difference value of the input code signal train in a predetermined time interval, and the pulse generator 28 should produce a digital code word representing the magnitude of one of the step sizes. Thus, the input code words, the code words from the pulse generator 28 and the registered code words in the register are summed up in algebraical fashion, and this result is registered again into the register. The contents of the register are read out to supply the read-out code words to the discriminating circuit.

What is claimed is:

1. A code conversion apparatus comprising:

an input terminal to which a first code signal is supplied; a digital bilateral integrating circuit provided with an increasing signal input connected to said input terminal and a decreasing signal input;

a signal discriminating circuit for judging whether the content of said digital bilateral integrating circuit exceeds a predetermined value and for producing a second code signal in response to the judged results;

a pulse generator adapted to receive said second code signal as input thereof for generating pulse signals groups of which have a predetermined relationship with the sequence of said second code signal, the clock rate of the pulses of said groups being sufficiently greater than the clock rate of said first code signal so that each group of pulse signals is generated over a time interval equal to or less than the clock period of said first code signal; and means for feeding back said groups of pulse signals to said decreasing signal input, whereby said second code signal from which a decoded signal substantially equal to the decoded signal from said first code signal is obtained and which has lower clock rate than that of said first code signal is produced at output side of said signal discriminating circuit.

2. A code conversion system for converting a predictable type first pulse code, each code pulse representing the polarity of a first predetermined magnitude step increment, to a predictable type second code, at a lower clock rate than the clock rate of said first code, each code pulse of said second code representing the polarity of a second predetermined magnitude step increment, comprising:

a digital bilateral integrating circuit receiving said first code at an increasing signal input thereof and including a decreasing signal input, discriminating circuit means for judging if the content of said integrating circuit equals or exceeds a predetermined value and for generating said second code in response to the judging results, pulse generator means, responsive to said second code, for generating groups of pulses, the number of pulses in each group being equal in number to the ratio of said second predetermined magnitude to said first predetermined magnitude, and means for applying said groups of pulses to said decreasing signal input.

3. The system of claim 2 wherein said pulse generator means comprises:

coincidence gate means, timing circuit means coupled to said gate means and responsive to said second code for enabling said gate means for a preselected time, and clock means coupled to said coincidence gate means, for generating clock pulses at a repetition rate determined by said ratio.

4. A code conversion system for converting a predictable type first pulse code, each code pulse representing the polarity of a first predetermined magnitude step increment, to a lower clock rate, predictable type second pulse code, each second code pulse representing the polarity of one of multiple possible step increments of different magnitudes, the magnitude of the step increments being determined in response to the relation between foregoing successive code pulses of said second code, comprising:

a digital bilateral integrating circuit receiving said first code at an increasing signal input thereof and including a decreasing signal input;

discriminating circuit means for judging if the contents of said integrating circuit equals or exceeds a predetermined value and for generating said second code in response to the judging results, pulse generator means responsive to said second code, for generating pulse groups of varying numbers of pulses in response to the relationship between the values of foregoing successive pulses of said second code, the clock rate of the pulses of said pulse groups being at a rate sufficiently greater than the clock rate of said first pulse code so that each pulse group is generated over a time interval equal to or less than the clock period of said first pulse code and means for applying said pulse groups to said decreasing signal input.

5. The code conversion system of claim 4 wherein said pulse generator means comprises:

means for producing signals representative of the relationship between two successive pulses of said second code, counter means, incremented in response to two successive identical pulses of said second code and reset in response to a loss of correspondence between successive pulses of said second code, and a pulse generating circuit, responsive to the counter means and said second code for generating pulse groups comprised of different numbers of pulses.

6. The code conversion system of claim 5 wherein said counter means includes means, responsive to a predetermined count, for blocking the further incrementing of said counter means.

7. The code conversion system of claim 6 wherein said pulse generating circuit comprises:

first and second control inputs, responsive to different counts in said counter means, a second code signal input, clock means for generating clock pulses at a substantially greater rate than the clock rate of said first code, and logic means for applying selected numbers of said clock pulses to said decreasing signal input in response to the signals on said first and second control inputs and second code signal input.

8. The code converter system of claim 7 wherein said logic means comprises:

shift register means, periodically preset at intervals corresponding to the frequency clock rate of said second code and responsive to said clock pulses for shifting the preset contents, first coincidence gate means, a first input thereof being coupled to said first control input, a second input being coupled to selected stages of said shift register, second coincidence gate means, a first input thereof being coupled to said second control input, a second input being coupled to selected stages of said shift register, exclusive OR gate means coupled to said second code signal input and the outputs of said first and second coincidence gates, and third coincidence gate means, coupled to the output of said exclusive OR gate and said clock means, whereby the output of said exclusive OR gate enables the passing of selected numbers of clock pulses to said decreasing signal input.

9. The code conversion system of claim 8 wherein said pulse generating circuit further includes, means responsive to a predetermined state of said shift register for blocking the further shifting of the contents thereof until the next succeeding preset time.

* * * * *